United States Patent [19]

Nowak

[11] Patent Number: 4,916,514
[45] Date of Patent: Apr. 10, 1990

[54] INTEGRATED CIRCUIT EMPLOYING DUMMY CONDUCTORS FOR PLANARITY

[75] Inventor: Matthew M. Nowak, San Diego, Calif.

[73] Assignee: Unisys Corporation, Blue Bell, Pa.

[21] Appl. No.: 200,410

[22] Filed: May 31, 1988

[51] Int. Cl.[4] .................... H01L 23/48; H01L 29/44; H01L 29/52; H01L 29/60
[52] U.S. Cl. ........................................ 357/68; 357/45; 357/71
[58] Field of Search .............................. 357/68, 45, 71

[56] References Cited

U.S. PATENT DOCUMENTS

| | | | |
|---|---|---|---|
| 3,634,927 | 1/1972 | Neale et al. | 357/68 |
| 4,199,778 | 4/1980 | Masuhara et al. | 357/68 |
| 4,322,736 | 3/1982 | Sasaki et al. | 357/68 |
| 4,484,212 | 11/1984 | Komatsu et al. | 357/68 |
| 4,500,906 | 2/1985 | Ohno et al. | 357/68 |

Primary Examiner—Rolf Hille
Assistant Examiner—Hoanganh Le
Attorney, Agent, or Firm—Charles J. Fassbender; Robert S. Bramson

[57] ABSTRACT

An integrated circuit having improved planarity includes a substrate, a plurality of transistors integrated into a top surface of the substrate, and a plurality of insulating layers over the top surface which are interleaved with respective sets of signal conductors. These signal conductors are spaced apart on the insulating layers and are routed through holes in the insulating layers to the transistors in order to carry signals to and from the transistors. Also, in accordance with the invention, the integrated circuit further includes dummy conductors on the insulating layers in the spaces between the signal conductors. These dummy conductors are open circuited and consequently carry no signals. Their function is purely mechanical; and specifically, they function to partially fill the spaces between the signal conductors such that an overlying insulating layer can be formed without peaks and valleys. For ease of fabrication, these dummy conductors are formed with the same mask and by the same steps as the signal conductors; and thus they are of the same material and have the same thickness as the signal conductors.

14 Claims, 4 Drawing Sheets

INTEGRATED CIRCUIT EMPLOYING DUMMY CONDUCTORS FOR PLANARITY

BACKGROUND OF THE INVENTION

This invention relates to integrated circuits; and more particularly, it relates to the manufacture of integrated circuits with a planar topography.

In the prior art, it is customary to fabricate integrated circuits on a thin flat semiconductor substrate called a wafer. During this fabrication, transistors are formed in the top surface of the substrate, and alternating layers of insulating material and patterned signal conductors are formed over the top surface in order to interconnect the transistors together.

A problem, however, with the above described prior art integrated circuit is that as the layers of insulating material and signal conductors are added to the circuit, the topography of the circuit becomes more and more nonplanar. When a cross section of the wafer is viewed under a microscope, each insulating layer will have peaks and valleys; and the signal conductors will go up and down o those peaks and valleys.

Each layer of signal conductors is formed from an unpatterned conductive layer by covering it with a layer of photoresist, and exposing the photoresist to light through a mask. However, the accuracy with which the mask's image can be transferred to the photoresist decreases as the nonplanarity of the photoresist increases. Why this is will now be explained with the help of FIG. 1.

There, reference numeral 10 indicates a semiconductor wafer; reference numeral 11 indicates a layer of photoresist on an unpatterned conductive layer; reference numeral 12 indicates a mask whose image is to be replicated in the photoresist; and reference numeral 13 indicates light which is passed through the mask to expose the photoresist. As this light passes through the mask, it diverges, as is indicated, for example, by reference numeral 13a; and a lens 14 is provided between the mask and the wafer in order to focus the light on the photoresist.

If, however, the unpatterned conductive layer and the overlying photoresist are nonplanar, then the mask image will not be accurately focused on the entire surface of the photoresist. When the lens 14 is positioned such that the mask image is accurately focused on the peaks of the photoresist 11, then the mask image will be out of focus on the valleys of the photoresist; and vice versa. This problem is herein called the depth of focus problem.

After the exposed portions of the photoresist are removed, the remaining photoresist patterns will have sharply defined (vertical) edges where the mask image was accurately focused. This is indicated by reference numeral 11a. Conversely, the remaining photoresist patterns will have rounded edges as is indicated by reference numeral 11b where the mask image was not accurately focused.

Since the edges of the photoresist cannot be accurately patterned over the entire surface of the wafer, it follows that the width of the corresponding signal conductors also cannot be accurately patterned. And, this in turn limits the density with which signal conductors can be fabricated.

Accordingly, a primary object of the invention is to provide an improved integrated circuit in which the insulating layers and interleaved signal conductors are substantially planar.

BRIEF SUMMARY OF THE INVENTION

An integrated circuit having improved planarity includes a substrate, a plurality of transistors integrated into a top surface of the substrate, and a plurality of insulating layers over the top surface which are interleaved with respective sets of signal conductors. These signal conductors are spaced apart on the insulating layers and are routed through holes in the insulating layers to the transistors in order to carry signals to and from the transistors. Also, in accordance with invention, the integrated circuit further includes dummy conductors on the insulating layers in the spaces between the signal conductors. These dummy conductors are open circuited, and thus they carry no signals. Their function is purely mechanical; and specifically, they function to partially fill the spaces between the signal conductors such that an overlying insulating layer can be formed without peaks and valleys. Also, for ease of fabrication, these dummy conductors are formed with the same mask and by the same steps as the signal conductors; and thus they are of the same material and have the same thickness as the signal conductors.

BRIEF DESCRIPTION OF THE DRAWINGS

Various features and advantages of the invention are described herein in conjunction with the accompanying drawings wherein.

DETAILED DESCRIPTION OF THE INVENTION

Figure 2:
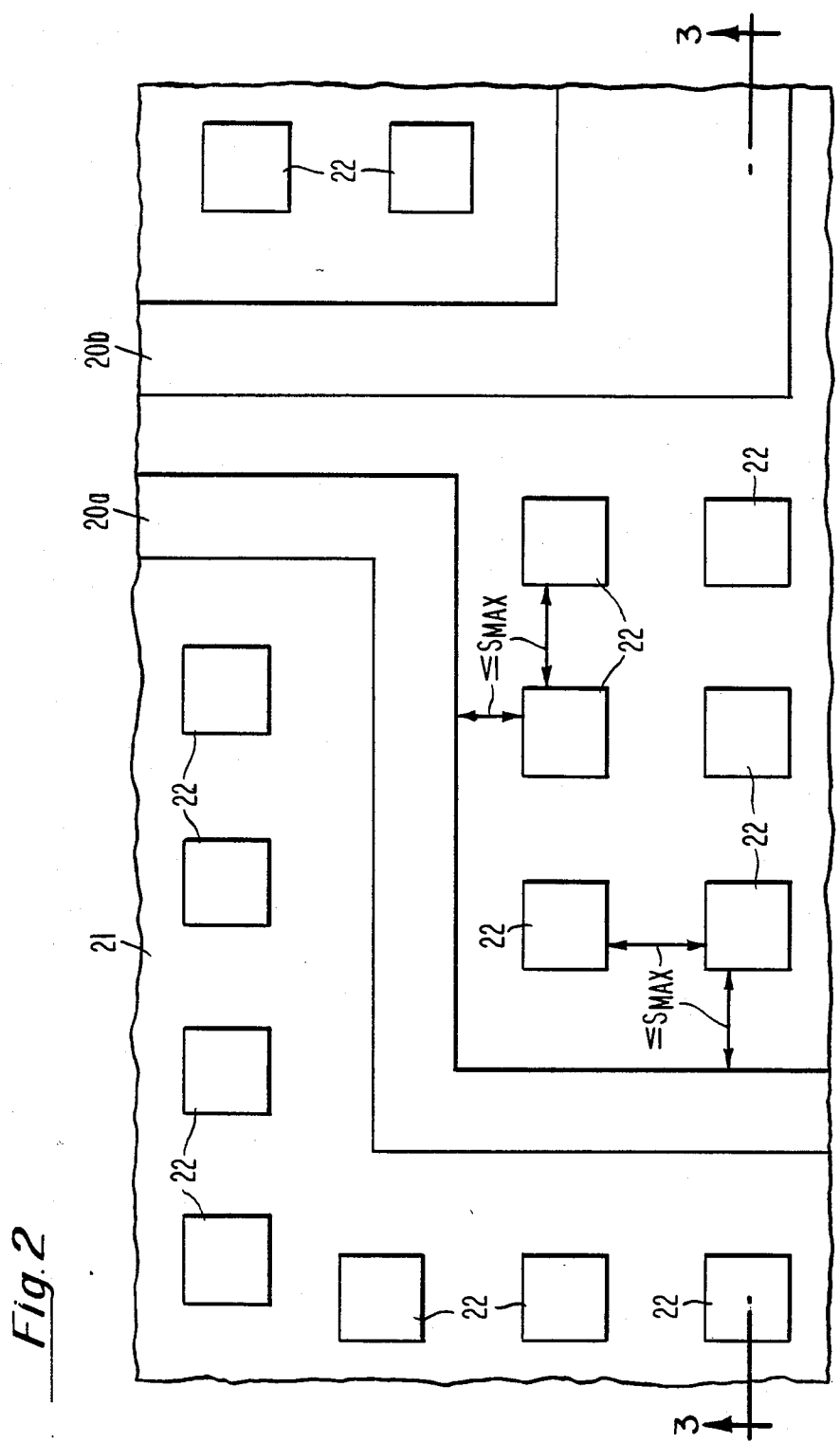
FIG. 2 is a greatly enlarged top view of an integrated circuit that is constructed according to the invention.

Referring now to FIG. 2, the details of a preferred embodiment of the invention will be described. In FIG. 2, reference numerals 20a and 20b indicate respective portions of two signal conductors which are patterned on an insulating layer 21. Layer 21 overlies a semiconductor substrate in which transistors (not shown) are fabricated; and the conductors 20a and 20b are patterned such that they interconnect the transistors in some predetermined fashion. Many other signal conductors (e.g., hundreds of them) are also patterned on other portions of insulating layer 21; and they are all spaced apart from one another.

Also, in accordance with the invention, a plurality of dummy conductors 22 are disposed on the insulating layer 21 such that they partially fill the spaces between the signal conductors. These dummy conductors 22 are made of the same material and have the same thickness as the signal conductors which they lie between; and they are patterned with the same mask and are formed by the same fabrication steps as the signal conductors. Consequently, no extra time or cost is associated with their fabrication.

Now the function which these dummy conductors serve is purely mechanical, not electrical. Thus, each of the dummy conductors is open circuited. Further, in order to properly meet its mechanical function, the dummy conductors are spaced apart from each other and from the signal conductors by no more than a certain maximum spacing $S_{MAX}$.

Spacing $S_{MAX}$ is selected such that the insulating layer which is subsequently formed over the signal conductors and dummy conductors will have a substantially planar surface. For example, in the case where the overlying insulating layer is a conformal type silicon dioxide with 70% step coverage, then $S_{MAX}$ must be less than 1.4 times the insulating layer's thickness.

Figure 3:
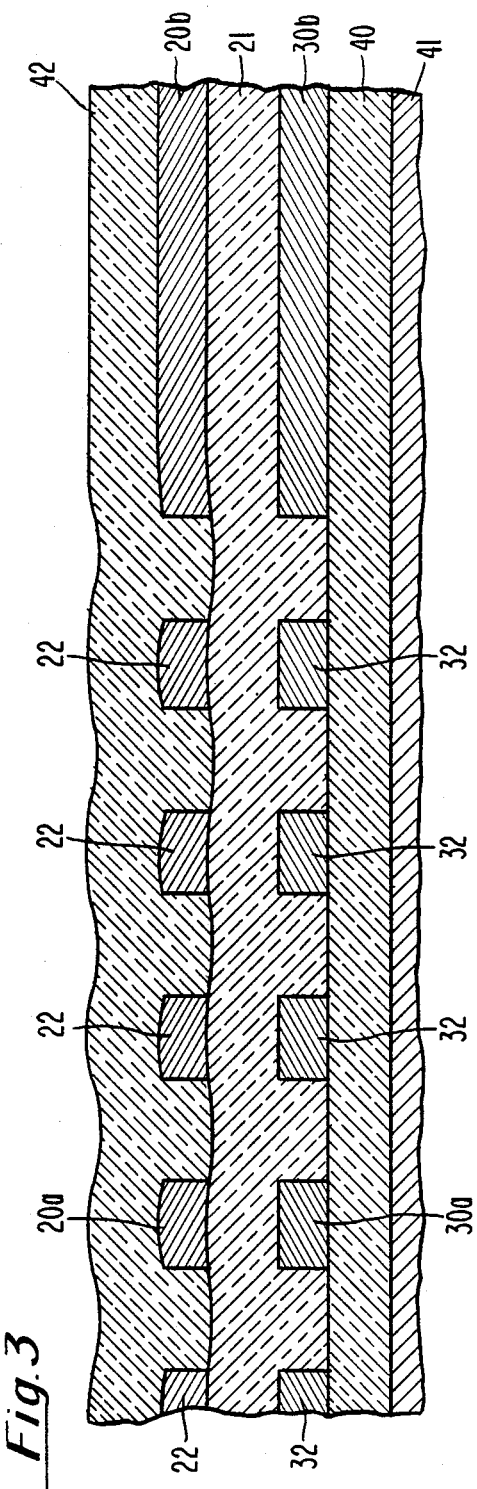
FIG. 3 is a sectional view of the circuit of FIG. 2 taken along lines 3—3.

Turning now to FIG. 3, it shows a cross section of the FIG. 2 structure taken along lines 3—3. In FIG. 3, items 20a, 20b, 21 and 22 are the same as shown in FIG. 2. In addition, FIG. 3 shows an underlying set of signal conductors 30a and 30b and an underlying set of dummy conductors 32. All of these items lie on an insulating layer 40 which itself lies on a semiconductor substrate 41 in which the transistors are formed. FIG. 3 also shows another insulating layer 42 which overlies the signal conductors 20a and 20b and the dummy conductors 22.

Figure 1:
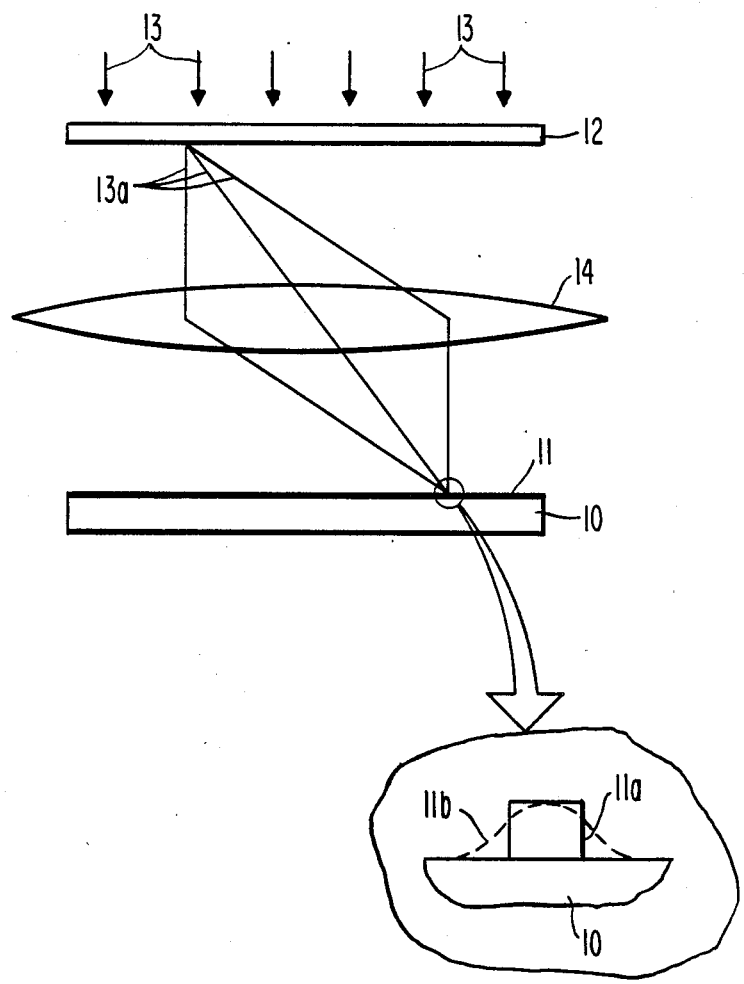
FIG. 1 illustrates the depth of focus problem which the present invention addresses.

Of primary importance in FIG. 3 is the fact that the top surfaces of insulating layers 21 and 42 are substantially planar. That is, the peaks and the valleys of those insulating layer are negligible in size. This is important because it enables the edges of the signal conductors which lie on those surfaces to be sharply defined by photoresist as was explained in conjunction with FIG. 1.

Figure 4:
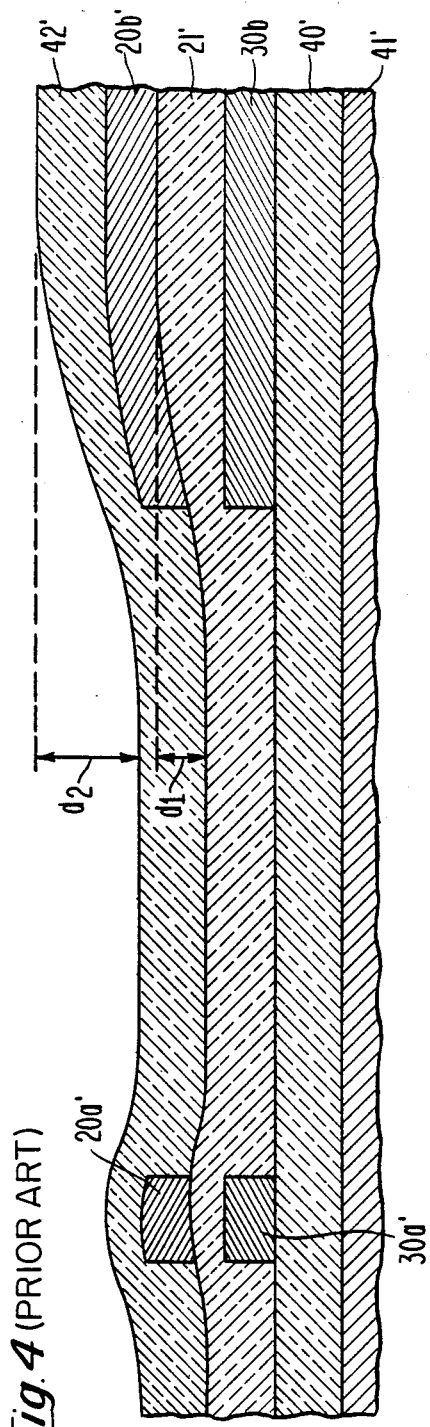
FIG. 4 is a sectional view of a circuit similar to that of FIG. 2 but which is constructed without any dummy conductors.

By comparison, FIG. 4 shows what a section through the FIG. 2 circuit will look like if the dummy conductors 22 and 32 are left out. In FIG. 4, signal conductors 20a', 20b', 30a', and 30b' correspond to signal conductors 20a, 20b, 30a and 30b of FIGS. 2 and 3; insulating layers 21', 40' and 42' correspond to insulating layers 21, 40 and 42; and substrate 41' corresponds to substrate 41.

Inspection of FIG. 4 shows that the difference $d_1$ between the peaks and valleys of insulating layer 21' is quite large; and, the difference $d_2$ between the peaks and the valleys of insulating layer 42' is even larger. In the worst case situation where the signal conductors 20a' and 30a' are far apart from the signal conductors 20b' and 30b', difference $d_1$ will equal the thickness of conductor 30a'; and, difference $d_2$ will equal the thickness of conductor 30a' plus the thickness of conductor 20a'.

Thus, when the dummy conductors are left out, the depth of focus problem becomes progressively worse with each succeeding layer of signal conductors. Typically, each layer of signal conductors is 0.75 microns to 1.25 microns thick. And, the depth of focus for a state of the art photoresist patterning system, such as a Nikon stepper Model 1505 having a G4D body type and a 0.45 numerical aperture lens is only 0.75 microns. Thus, when that stepper is used without the dummy conductors, depth of focus becomes a problem after just the first layer of conductors is patterned.

Figure 5A:
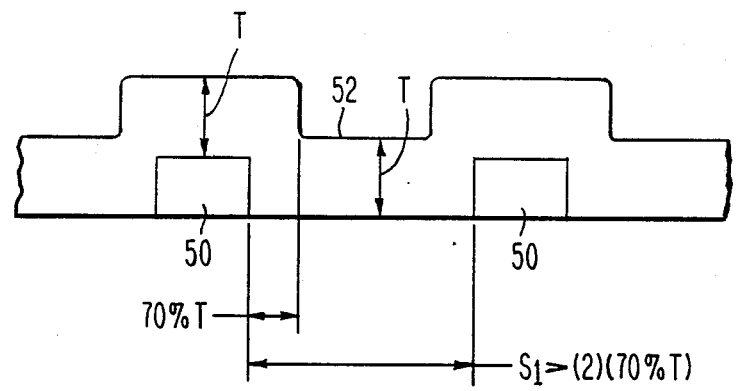
FIGS. 5A and 5B illustrate a constraint on the spacing of the dummy conductors in one preferred embodiment of the invention.
Figure 5B:
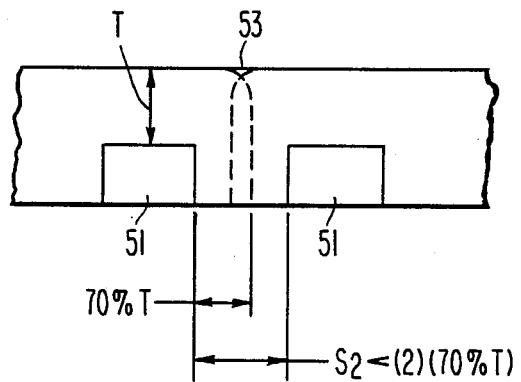

Turning now to FIGS. 5A and 5B, they explain the spacing constraint $S_{MAX}$ on the dummy conductors which was previously given. In FIG. 5A, two dummy conductors 50 are shown with a spacing $S_1$ which is more than $S_{MAX}$; whereas in FIG. 5B, two dummy conductors 51 are shown with a spacing $S_2$ which is less than $S_{MAX}$. In both figures, a conformal layer of insulating material, such as $SiO_2$ or $Si_3N_4$ or oxynitride, having a thickness T and a step coverage of 70% is used to cover the dummy conductors. Such a 70% step coverage can be achieved by conventional low temperature vapor deposition methods.

If the spacing between two successive dummy conductors is greater than the thickness T times twice the step coverage, then the insulating material on the sidewalls of the two dummy conductors will not merge. Instead, a valley 52 will be formed between them as is shown in FIG. 5A. Conversely, if the spacing between two successive dummy conductors is less than twice the step coverage times thickness T, then insulating material on the sidewalls of the two conductors will merge and form one smooth surface 53 as occurs in FIG. 5B.

A preferred embodiment of the invention has now been described in detail. In addition, however, many changes and modifications can be made to these details without departing from the nature and spirit of the invention. For example, in the above described embodiment, the dummy conductors are all shaped as squares. However, the dummy conductors can alternatively be shaped as rectangles or polygons.

Further in the above described embodiment, the signal conductors were disposed in just two layers over the substrate. But as an alternative, additional layers of signal conductors, with dummy conductors between them, can be fabricated on respective insulating layers. And, each layer of conductors can be fabricated with various materials such as metal or polysilicon.

Also in the above described embodiment, several dummy conductors which were arranged in an array were used to partially fill the spaces between the signal conductors. But as an alternative, one large dummy conductor could be used to fill each space. However, an array of small dummy conductors is preferred since it minimizes any parasitic capacitive coupling which the dummy conductors might make between a signal conductor and another circuit element. For this reason, the preferred minimum spacing between successive dummy conductors, and between a dummy conductor and a signal conductor, is at least one-half micron, and the preferred size of a dummy conductor is one-half to four microns on a side.

Also in the above described embodiment, a conformal type insulating layer was used to cover the dummy conductors. But as an alternative, any nonconformal insulating layer, such as spun-on glass or polyimide, can be used to cover the dummy conductors. Note, however, that such nonconformal insulating layers by themselves do not eliminate the depth of focus problem which the present invention addresses. All they do is smooth out the topography and make the differences that occur between the peaks and valleys in the insulating layer less abrupt.

Further in the above described embodiment, the signal conductors and dummy conductors were described as being formed on a semiconductor substrate in which transistors were fabricated. However, as another alternative, the substrate can be ceramic in which no transistors are formed; and the signal conductors can be patterned on insulating layers over the ceramic to form an interconnect pattern for multiple integrated circuit chips.

Accordingly, it is to be understood that the invention is not limited to the above details but is defined by the appended claims.

What is claimed is:

1. An integrated circuit having improved planarity; said integrated circuit being of a type which includes a substrate, a plurality of transistors integrated into one surface of said substrate, and a plurality of insulating layers over said transistors which are interleaved with respective sets of signal conductors; said signal conductors being spaced apart on said insulating layers and routed through holes in said insulating layers to said transistors for carrying signals to and from said transistors, wherein, said integrated circuit further includes dummy conductors on at least one of the insulating layers in the spaces between said signal conductors;

said dummy conductors being of the same thickness and material as the signal conductors which they lie between and being open circuited; and, said dummy conductors being spaced apart from each other and from said signal conductors by no more than a certain maximum distance at which the adjacent overlying insulating layer becomes substantially planar.

2. An integrated circuit according to claim 1 wherein all of said dummy conductors are similarly shaped and are disposed as an array between said signal conductors.

3. An integrated circuit according to claim 1 wherein said dummy conductors are disposed as an array of squares between said signal conductors.

4. An integrated circuit according to claim 1 wherein said dummy conductors are spaced apart from each other and from said signal conductors by at least one-half micron.

5. An integrated circuit according to claim 1 wherein said dummy conductors as well as said signal conductors on at least one insulating layer are metal conductors.

6. An integrated circuit according to claim 1 wherein said dummy conductors as well as said signal conductors on at least one insulating layer are polysilicon conductors.

7. An integrated circuit according to claim 1 wherein said insulating layer overlying and adjacent to said dummy conductors consists essentially of a material that is selected from the set of $SiO_2$, $Si_3N_4$, oxynitride, and a polyimide.

8. An integrated circuit according to claim 1 wherein said dummy conductors lie on multiple insulating layers.

9. An integrated circuit according to claim 1 wherein said dummy conductors are squares of one-half to four microns on a side.

10. For use with integrated circuits, an interconnect structure having improved planarity; said interconnect structure comprising a substrate having a major surface, a plurality of insulating layers over said surface, and respective sets of signal conductors between said insulating layers for carrying signals to and from said circuits; wherein, on at least one of said insulating layers, dummy conductors are patterned between said signal conductors which (a) are of the same thickness and material as the signal conductors between which they lie, (b) are open circuited so they do not operate electrically, and (c) are spaced apart from each other and from said signal conductors by no more than a certain maximum distance at which the adjacent overlying insulating layer becomes substantially planar.

11. An interconnect structure according to claim 10 wherein said substrate is a semiconductor having transistors integrated into said major surface.

12. An interconnect structure according to claim 10 wherein said substrate is ceramic.

13. An interconnect structure according to claim 10 wherein said dummy conductors are similarly shaped and are disposed as an array between said signal conductors.

14. An interconnect structure according to claim 10 wherein said dummy conductors lie on multiple insulating layers.

* * * * *